(12) United States Patent
Alexander et al.

(10) Patent No.: US 11,770,149 B2
(45) Date of Patent: Sep. 26, 2023

(54) MOBILE DEVICE POSITIONER AND CONFIGURABLE MOBILE DEVICE HOLDER

(71) Applicant: QUALCOMM Incorporated, San Diego, CA (US)

(72) Inventors: Raymond Alexander, Vista, CA (US); Neil Burns, San Diego, CA (US); Derek Punch, Escondido, CA (US); Norman Himaka, Spring Valley, CA (US); James Beckwith, La Mesa, CA (US); Dave Henry, San Clemente, CA (US); Joshua Britton, Irvine, CA (US); Francis Pearce, Escondido, CA (US); Michael Harrington, Chula Vista, CA (US); Paul Sithideth, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 456 days.

(21) Appl. No.: 17/194,171

(22) Filed: Mar. 5, 2021

(65) Prior Publication Data

US 2022/0038129 A1 Feb. 3, 2022

Related U.S. Application Data

(60) Provisional application No. 63/058,361, filed on Jul. 29, 2020.

(51) Int. Cl.
*H04M 1/23* (2006.01)
*H04B 1/3877* (2015.01)
(Continued)

(52) U.S. Cl.
CPC ......... *H04B 1/3877* (2013.01); *F16M 11/041* (2013.01); *F16M 13/022* (2013.01); *F16M 2200/066* (2013.01)

(58) Field of Classification Search
CPC .. H04B 1/3877; F16M 11/041; F16M 13/022; F16M 2200/066
See application file for complete search history.

(56) References Cited

U.S. PATENT DOCUMENTS

| 8,931,770 B1 | 1/2015 | Kaminski |
| 2006/0197535 A1 | 9/2006 | Ivannikov et al. |

(Continued)

FOREIGN PATENT DOCUMENTS

WO 2015059508 A1 4/2015

OTHER PUBLICATIONS

International Search Report and Written Opinion—PCT/US2021/038728—ISA/EPO—dated Oct. 28, 2021.
(Continued)

*Primary Examiner* — Moustapha Diaby
(74) *Attorney, Agent, or Firm* — Loza & Loza, LLP

(57) ABSTRACT

A mobile device holder that includes a body having a plurality of cavities. The mobile device holder includes a first assembly, a second assembly, and a third assembly. The first assembly is coupled to the body. The first assembly is configurable to be coupled to different portions of the body. The first assembly includes a first arm configured to be coupled to the body, a first slider coupled to the first arm, where the first slider is configured to move along the first arm, a first cap coupled to the first arm, and a first screw coupled to the first cap, where the first screw is configured to move the first slider along the first arm and towards the body.

26 Claims, 11 Drawing Sheets

(51) Int. Cl.
*F16M 11/04* (2006.01)
*F16M 13/02* (2006.01)

(56) References Cited

U.S. PATENT DOCUMENTS

| | | | |
|---|---|---|---|
| 2012/0025036 A1* | 2/2012 | Huang | F16M 11/041 248/122.1 |
| 2012/0312936 A1* | 12/2012 | Huang | F16M 11/041 248/316.1 |
| 2013/0301216 A1* | 11/2013 | Trinh | A47F 7/0246 361/679.58 |
| 2014/0263931 A1* | 9/2014 | Chen | F16M 13/00 248/576 |
| 2015/0060624 A1* | 3/2015 | Huang | B60R 11/0241 248/316.4 |
| 2017/0049251 A1* | 2/2017 | Gulick, Jr. | F16M 13/00 |
| 2018/0252358 A1* | 9/2018 | Yang | B60R 11/02 |
| 2021/0123268 A1* | 4/2021 | Gulick, Jr. | F16M 13/00 |
| 2021/0228000 A1* | 7/2021 | Schuft | F16M 11/041 |
| 2021/0367638 A1* | 11/2021 | Peng | H04B 1/3877 |

OTHER PUBLICATIONS

Konig&Meyer: "Tablet PC holder", Jul. 1, 2016 (Jul. 1, 2016), pp. 1-1, XP055851049, Retrieved from the Internet: URL: https://www.k-m.de/en/kmPdf/datasheet/ordernumber/19791-016-55 [retrieved on Oct. 13, 2021] the whole document.

* cited by examiner

MOBILE DEVICE POSITIONER AND CONFIGURABLE MOBILE DEVICE HOLDER

CROSS-REFERENCE/CLAIM OF PRIORITY TO RELATED APPLICATION

The present application claims priority to and the benefit of U.S. Provisional Application No. 63/058,361, filed on Jul. 29, 2020, and titled, "MOBILE DEVICE POSITIONER AND CONFIGURABLE MOBILE DEVICE HOLDER", which is hereby expressly incorporated by reference.

FIELD

Various features relate to mobile device holders and positioners.

BACKGROUND

Mobile devices are tested in order to confirm and/or validate that the mobile devices perform as designed. For example, mobile devices are tested to determine and calibrate the radio frequency (RF) performance of the mobile devices. Testing mobile devices includes testing how well an antenna of a mobile device transmits and/or receives signals. There is an ongoing need to provide devices and/or components that are used in testing mobile devices, so that the devices and/or components do not interfere in the transmission and reception of signals to and from an antenna of a mobile device.

SUMMARY

Various features relate to mobile device holders and positioners.

One example provides a mobile device holder that includes a body having a plurality of cavities. The mobile device holder includes a first assembly, a second assembly, and a third assembly. The first assembly is coupled to the body. The first assembly is configurable to be coupled to different portions of the body. The first assembly includes a first arm configured to be coupled to the body, a first slider coupled to the first arm, where the first slider is configured to move along the first arm, a first cap coupled to the first arm, and a first screw coupled to the first cap, where the first screw is configured to move the first slider along the first arm and towards the body. The second assembly is coupled to the body. The second assembly is configurable to be coupled to different portions of the body. The second assembly includes a second arm configured to be coupled to the body, a second slider coupled to the second arm, where the second slider is configured to move along the second arm, a second cap coupled to the second arm, and a second screw coupled to the second cap, where the second screw is configured to move the second slider along the second arm and towards the body. The third assembly is coupled to the body. The third assembly is configurable to be coupled to different portions of the body. The third assembly includes a third arm configured to be coupled to the body, a third slider coupled to the third arm, where the third slider is configured to move along the third arm, a third cap coupled to the third arm, and a third screw coupled to the third cap, where the third screw is configured to move the third slider along the third arm and towards the body.

Another example provides a mobile device positioner that includes a base, a first frame coupled to the base, a first component coupled to the first frame, where the first component is configured to rotate a component along a first plane, a second frame coupled to the first component, a second component coupled to the second frame, where the second component configured to rotate a component along a second plane, and a mobile device holder coupled to the second component. The mobile device holder includes a body having a plurality of cavities. The mobile device holder includes a first assembly, a second assembly, and a third assembly. The first assembly is coupled to the body. The first assembly is configurable to be coupled to different portions of the body. The first assembly includes a first arm configured to be coupled to the body, a first slider coupled to the first arm, where the first slider is configured to move along the first arm, a first cap coupled to the first arm, and a first screw coupled to the first cap, where the first screw is configured to move the first slider along the first arm and towards the body. The second assembly is coupled to the body. The second assembly is configurable to be coupled to different portions of the body. The second assembly includes a second arm configured to be coupled to the body, a second slider coupled to the second arm, where the second slider is configured to move along the second arm, a second cap coupled to the second arm, and a second screw coupled to the second cap, where the second screw is configured to move the second slider along the second arm and towards the body. The third assembly is coupled to the body. The third assembly is configurable to be coupled to different portions of the body. The third assembly includes a third arm configured to be coupled to the body, a third slider coupled to the third arm, where the third slider is configured to move along the third arm, a third cap coupled to the third arm, and a third screw coupled to the third cap, where the third screw is configured to move the third slider along the third arm and towards the body.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a mobile device holder and a positioner. The positioner may be a manual positioner or a motorized positioner. The positioner may include a mobile device holder. The mobile device holder may be a configurable mobile device holder. The mobile device holder includes a body having a plurality of cavities. The mobile device holder includes a first assembly, a second assembly, and a third assembly. The first assembly is coupled to the body. The first assembly is configurable to be coupled to different portions of the body. The first assembly includes a first arm configured to be coupled to the body, a first slider coupled to the first arm, where the first slider is configured to move along the first arm, a first cap coupled to the first arm, and a first screw coupled to the first cap, where the first screw is configured to move the first slider along the first arm and towards the body. The second assembly is coupled to the body. The second assembly is configurable to be coupled to different portions of the body. The second assembly includes a second arm configured to be coupled to the body, a second slider coupled to the second arm, where the second slider is configured to move along the second arm, a second cap coupled to the second arm, and a second screw coupled to the second cap, where the second screw is configured to move the second slider along the second arm and towards the body. The third assembly is coupled to the body. The third assembly is configurable to be coupled to different portions of the body. The third assembly includes a third arm configured to be coupled to the body, a third slider coupled to the third arm, where the third slider is configured to move along the third arm, a third cap coupled to the third arm, and a third screw coupled to the third cap, where the third screw is configured to move the third slider along the third arm and towards the body. The mobile device holder may include a fourth assembly. The mobile device holder is configurable to hold mobile devices of various sizes and shapes. Different mobile devices may have different numbers of antennas and these antennas may be located in different parts of the mobile devices. The first, second, and third assemblies may be positioned and coupled to different portions of the body so as to not interfere with the various antennas of different mobile devices.

Exemplary Configurable Mobile Device Holder

Figure 1:
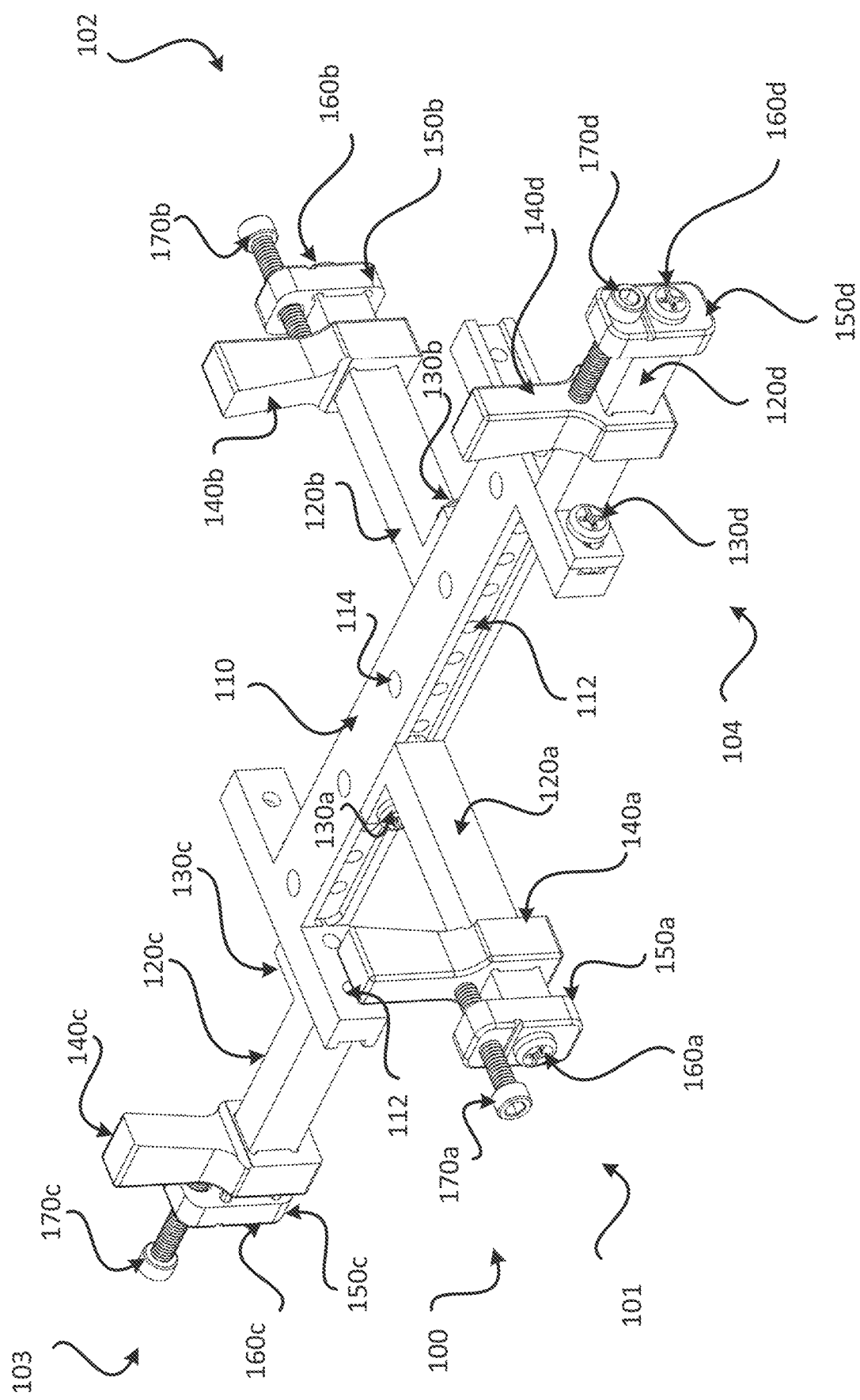
FIG. 1 illustrates an exemplary view of a configurable mobile device holder.

FIG. 1 illustrates a view of a mobile device holder 100. The mobile device holder 100 may be a configurable mobile device holder. The mobile device holder 100 is configured to hold and/or couple to mobile devices of various shapes and/or sizes. As will be further described below, the mobile device holder 100 includes moveable and/or configurable components that can be located in different locations so as to not interfere with antennas of a mobile device. Moreover, the various components are made of non-metallic materials so as to no affect signals (e.g., radio frequency (RF) signal, 5G RF millimeter wave signal) coming to and from the antennas of the mobile devices.

The mobile device holder 100 includes a body 110 having a plurality of cavities 112 and a plurality of cavities 114. The plurality of cavities 112 may be located through various surfaces of the body 110. The plurality of cavities 114 may be located through various surfaces of the body 110. The mobile device holder 100 includes a first assembly 101, a second assembly 102, a third assembly 103 and a fourth assembly 104.

The first assembly 101 is coupled to a first portion of the body 110. The first assembly 101 is configurable to be coupled to different portions of the body 110. The first assembly 101 includes a first arm 120a, a fastener 130a, a first slider 140a, a first cap 150a, a fastener 160a, and a first screw 170a. The first arm 120a is configured to be coupled to the body 110. The fastener 130a may be used to couple the first arm 120a to a first portion of the body 110. The fastener 130a may extend through a cavity in the first arm 120a and a first cavity from the plurality of cavities 112 of the body 110. The first slider 140a is coupled to the first arm 120a. The first slider 140a is configured to move along the first arm 120a. For example, the first slider 140a is configured to be able to move back and forth along a length of the first arm 120a. The first cap 150a is coupled to an end of the first arm 120a. The fastener 160a may be used to couple the first cap 150a to the first arm 120a. The first screw 170a is coupled to the first cap 150a. The first screw 170a is configured to move the first slider 140a along the first arm 120a and towards the body 110 and/or away from the first cap 150a. Turning the first screw 170a may move the first slider 140a towards the body 110.

The second assembly 102 is coupled to a second portion of the body 110. The second assembly 102 is configurable to be coupled to different portions of the body 110. The second assembly 102 includes a second arm 120b, a fastener 130b, a second slider 140b, a second cap 150b, a fastener 160b, and a second screw 170b. The second arm 120b is configured to be coupled to the body 110. The fastener 130b may be used to couple the second arm 120b to a second portion of the body 110. The fastener 130b may extend through a cavity in the second arm 120b and a second cavity from the plurality of cavities 112 of the body 110. The second slider 140b is coupled to the second arm 120b. The second slider 140b is configured to move along the second arm 120b. For example, the second slider 140b is configured to be able to move back and forth along a length of the second arm 120b. The second cap 150b is coupled to an end of the second arm 120b. The fastener 160b may be used to couple the second cap 150b to the second arm 120b. The second screw 170b is coupled to the second cap 150b. The second screw 170b is configured to move the second slider 140b along the second arm 120b and towards the body 110 and/or away from the second cap 150b. Turning the second screw 170b may move the second slider 140b towards the body 110.

The third assembly 103 is coupled to a third portion of the body 110. The third assembly 103 is configurable to be coupled to different portions of the body 110. The third assembly 103 includes a third arm 120c, a fastener 130c, a third slider 140c, a third cap 150c, a fastener 160c, and a third screw 170c. The third arm 120c is configured to be coupled to the body 110. The fastener 130c may be used to couple the third arm 120c to a third portion of the body 110. The fastener 130c may extend through a cavity in the third arm 120c and a third cavity from the plurality of cavities 112 of the body 110. The third slider 140c is coupled to the third arm 120c. The third slider 140c is configured to move along the third arm 120c. For example, the third slider 140c is configured to be able to move back and forth along a length of the third arm 120c. The third cap 150c is coupled to an end of the third arm 120c. The fastener 160c may be used to couple the third cap 150c to the third arm 120c. The third screw 170c is coupled to the third cap 150c. The third screw 170c is configured to move the third slider 140c along the third arm 120c and towards the body 110 and/or away from the third cap 150c. Turning the third screw 170c may move the third slider 140c towards the body 110.

The fourth assembly 104 is coupled to a fourth portion of the body 110. The fourth assembly 104 is configurable to be coupled to different portions of the body 110. The fourth assembly 104 includes a fourth arm 120d, a fastener 130d, a fourth slider 140d, a fourth cap 150d, a fastener 160d, and a fourth screw 170d. The fourth arm 120d is configured to be coupled to the body 110. The fastener 130d may be used to couple the fourth arm 120d to a fourth portion of the body 110. The fastener 130d may extend through a cavity in the fourth arm 120d and a fourth cavity from the plurality of cavities 112 of the body 110. The fourth slider 140d is coupled to the fourth arm 120d. The fourth slider 140d is configured to move along the fourth arm 120d. For example, the fourth slider 140d is configured to be able to move back and forth along a length of the fourth arm 120d. The fourth cap 150d is coupled to an end of the fourth arm 120d. The fastener 160d may be used to couple the fourth cap 150d to the fourth arm 120d. The fourth screw 170d is coupled to the fourth cap 150d. The fourth screw 170d is configured to move the fourth slider 140d along the fourth arm 120d and towards the body 110 and/or away from the fourth cap 150d. Turning the fourth screw 170d may move the fourth slider 140d towards the body 110.

It is also noted that the caps (e.g., 150a, 150b, 150c, 150d) may be coupled to different portions of the arm and is not limited to being coupled to an end portion of the arm. More detailed examples of an arm, a slider and a cap are illustrated and described below in at least FIGS. 6-11.

Different implementations may use different materials for the various components of the mobile device holder 100. The materials of the various components may be non-metallic and radio frequency (RF) transparent (e.g., 5G RF millimeter wave transparent). A material that is RF transparent (e.g., 5G RF millimeter wave signal transparent) means that a RF field can penetrate the material with little or no heating of the material. For example, the body 110, the first assembly 101, the second assembly 102, the third assembly 103 and/or the fourth assembly 104 may include at least one non-metallic material. The body 110, the first assembly 101, the second assembly 102, the third assembly 103 and/or the fourth assembly 104 may be free of a metallic material.

Examples of materials that may be used for the various components of the mobile device holder include Ertalyte-PET-P, polycarbonate, Rohacell High Frequency (RohacellHF), nylon, phenolic resin, Peek, and/or combinations thereof.

ErtalytePET-P is a semi-crystalline thermoplastic polyester that has good dimensional stability, coupled with excellent wear resistance, low coefficient of friction and high strength. This material may be used where high loads or wear resistance between moving parts is desired. Polycarbonate is a clear material that has a combination of good machineability, strength and RF transparency (e.g., 5G RF millimeter wave signal transparency). RohacellHF has very good RF transparency (e.g., 5G RF millimeter wave signal transparency), but has poor strength and machinability. Peek (chemically known as Polyetheretherketone) is used when the fasteners are used under hi-strength or constant reuse situations. Some of the benefits of peek fasteners are excellent fatigue resistance, friction resistance, abrasion resistance, creep resistance, temperature and chemical resistance. Nylon may be used in static situations. Compared to Peek, Nylon is extremely cost effective, but Nylon swells (and stretches) due to humidity. Nylon may not be suitable in hi-reuse or strength conditions. Phenolic Resin (which is a fiberglass) is stronger than Nylon, won't absorb moisture and possesses excellent thermal properties.

In one example, the body 110, the arms (e.g., first arm 120a, second arm 120b, third arm 120c, fourth arm 120d), and the caps (e.g., first cap 150a, second cap 150b, third cap 150c, fourth cap 150d) may include polycarbonate. The sliders (e.g., first slider 140a, second slider 140b, third slider 140c, fourth slider 140d) may include Ertalyte PET-P, and the screws (e.g., first screw 170a, second screw 170b, third screw 170c, fourth screw 170d) and fasteners (e.g., 130a, 130b, 130c, 130d, 160a, 160b, 160c, 160d) may include Peek. However, any of the components of the mobile device holder 100 may include any of the materials described above, including combinations of the materials.

Figure 2:
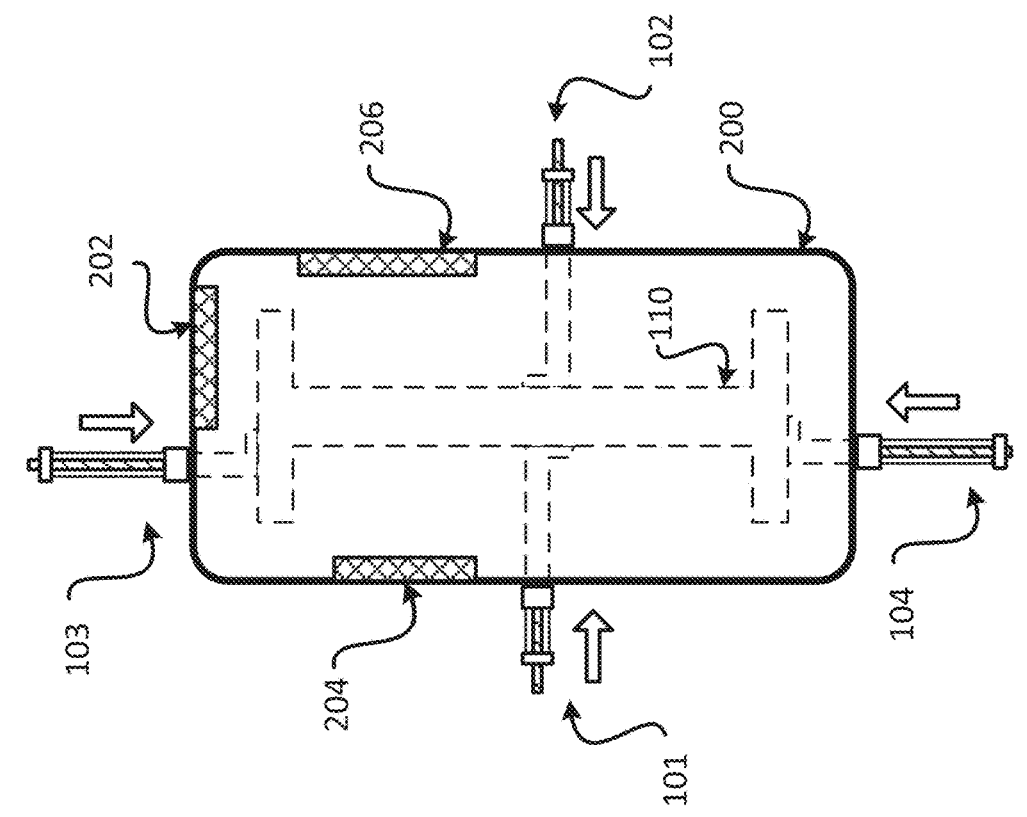
FIG. 2 illustrates an exemplary view of a configuration of a configurable mobile device holder coupled to a mobile device.
Figure 2:
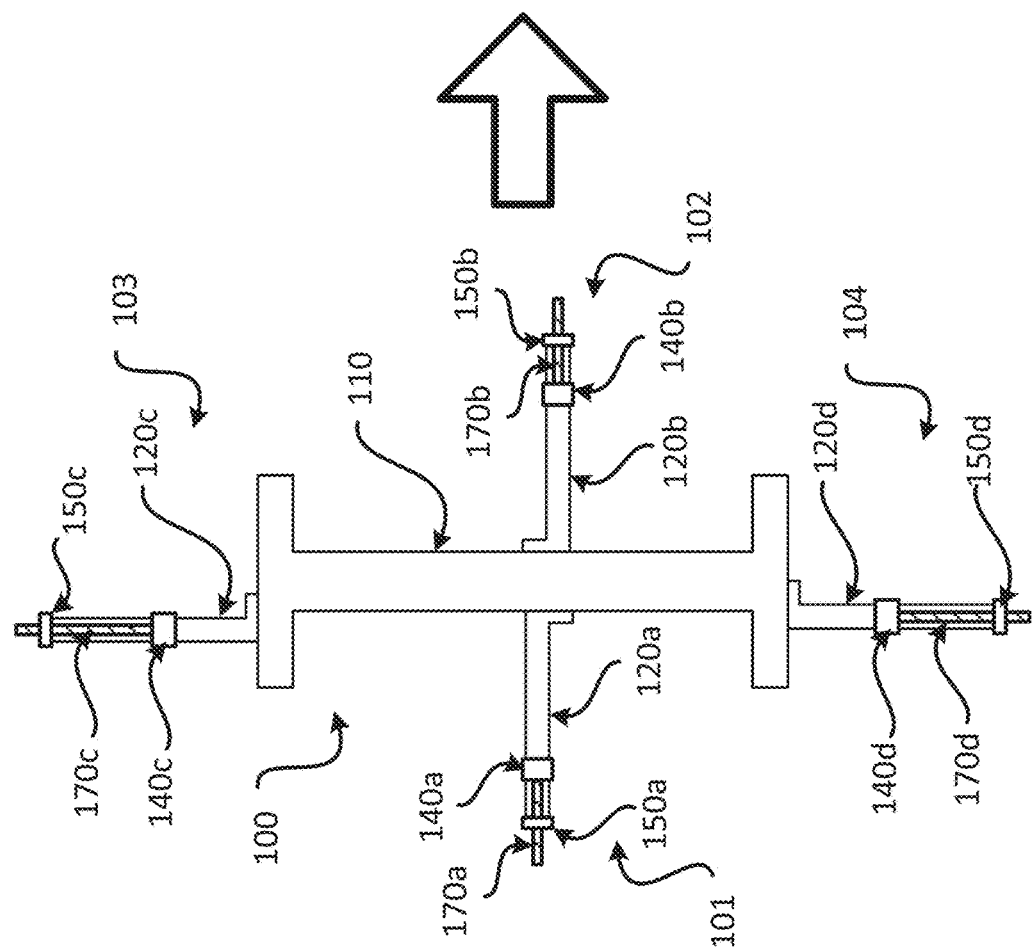

FIG. 2 illustrates a view of how a mobile device may be coupled to a mobile device holder. FIG. 2 illustrates a configuration of the mobile device holder 100 that is coupled to a mobile device 200. The mobile device 200 includes a first antenna 202, a second antenna 204, and a third antenna 206. One or more of the antennas (e.g., 202, 204, 206) may be configured to transmit and receive cellular signals (e.g., 2G, 3G, 4G and/or 5G signals) and/or wireless signals (e.g., WIFI signals).

The mobile device 200 may be coupled to the mobile device holder 100 with the front side or the back side of the mobile device 200 facing the mobile device holder 100. To minimize the effects of the components of the mobile device holder 100 on the transmitting and receiving of signals to and from the antennas (e.g., 202, 204, 206), the various assemblies (e.g., 101, 102, 103, 104) are coupled to the body 110, such that the assemblies are not located over and/or near the antennas. For example, in the example of FIG. 2, the first assembly 101 is coupled to a middle portion of a first side of the body 110, the second assembly 102 is coupled to a middle portion of a second side of the body 110, the third assembly 103 is coupled to an upper left portion of the body 110, and the fourth assembly 104 is coupled to a bottom portion of the body 110.

The first screw 170a may be turned, which pushes the first slider 140a towards the left side of the mobile device 200. The second screw 170b may be turned, which pushes the second slider 140b towards the right side of the mobile device 200. The third screw 170c may be turned, which pushes the third slider 140*c* towards the top side of the mobile device 200. The fourth screw 170*d* may be turned, which pushes the fourth slider 140*d* towards the bottom side of the mobile device 200. The combination of the body 110, the first assembly 101, the second assembly 102, the third assembly 103 and the fourth assembly 104 holds and clamps the mobile device 200 in place, so that the mobile device 200 remains fixed relative to the body 110 and/or the mobile device holder 100.

Figure 3:
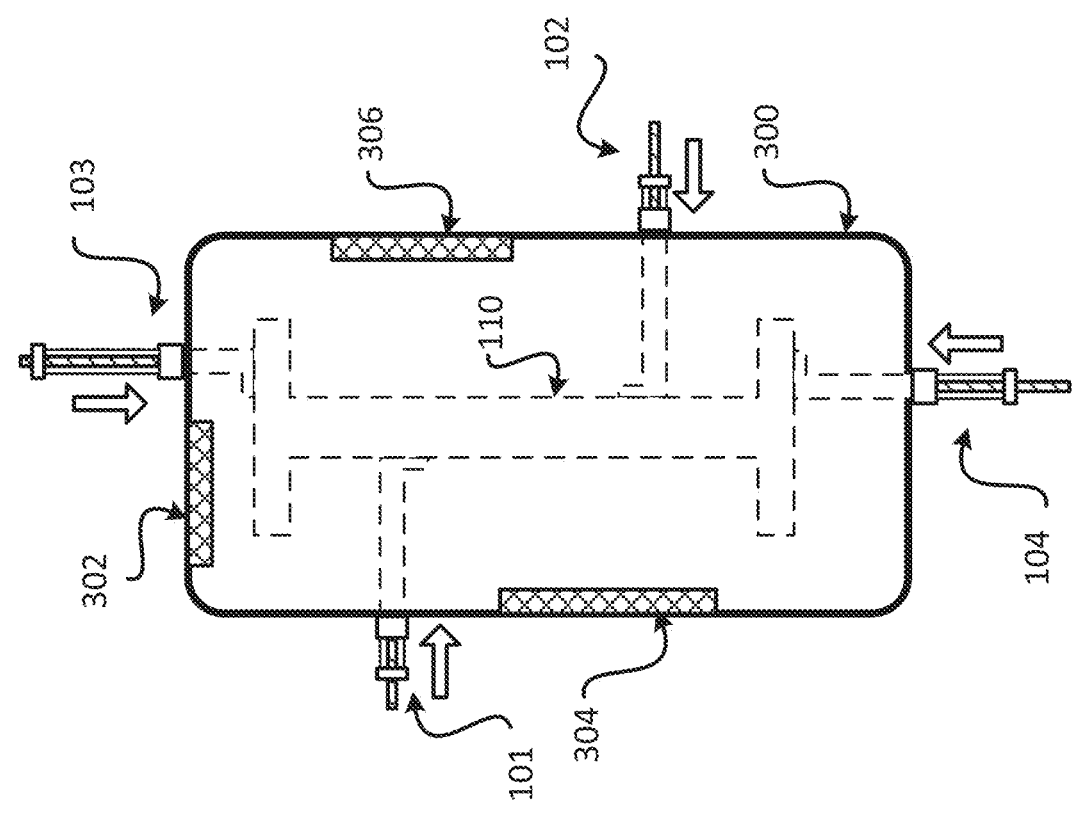
FIG. 3 illustrates an exemplary view of another configuration of a configurable mobile device holder coupled to a mobile device.
Figure 3:
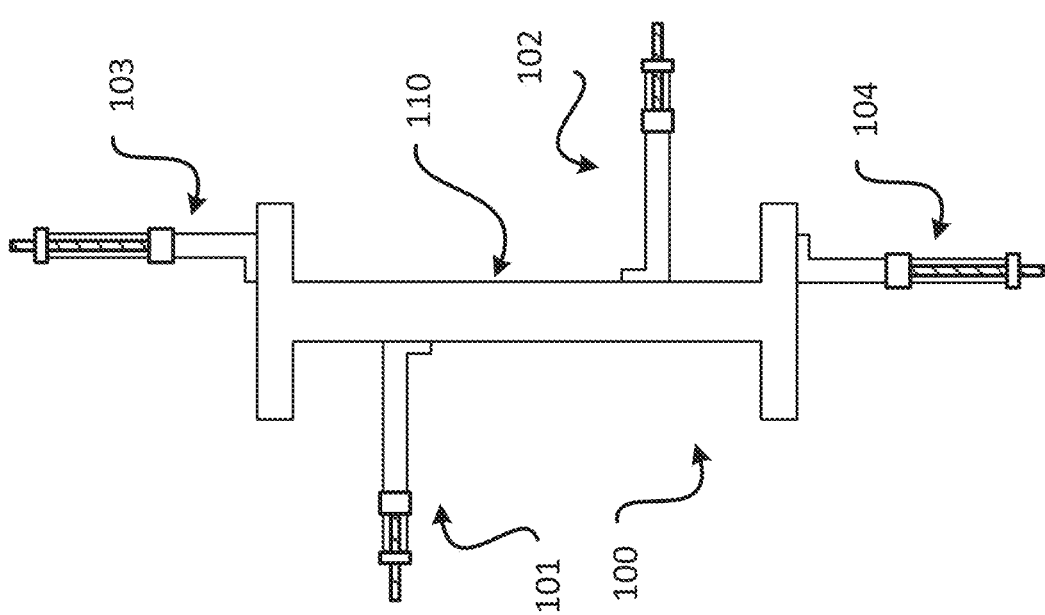

FIG. 3 illustrates a view of how a mobile device may be coupled to a mobile device holder. FIG. 3 illustrates another configuration of the mobile device holder 100 that is coupled to a mobile device 300. The mobile device 300 includes a first antenna 302, a second antenna 304, and a third antenna 306. One or more of the antennas (e.g., 302, 304, 306) may be configured to transmit and receive cellular signals (e.g., 2G, 3G, 4G and/or 5G signals) and/or wireless signals (e.g., WIFI signals). The mobile device 300 has a different size and shape than the mobile device 200. Additionally, the antennas of the mobile device 300 are located in different locations than the antennas of the mobile device 200.

In the configuration of the mobile device holder 100 of FIG. 3, the first assembly 101, the second assembly 102, the third assembly 103 and the fourth assembly 104 are coupled to different portions of the body 110 than how the assemblies are coupled in FIG. 2. The first assembly 101 is coupled to an upper portion of a first side of the body 110, the second assembly 102 is coupled to a lower portion of a second side of the body 110, the third assembly 103 is coupled to an upper right portion of the body 110, and the fourth assembly 104 is coupled to a bottom right portion of the body 110. The combination of the body 110, the first assembly 101, the second assembly 102, the third assembly 103 and the fourth assembly 104 holds and clamps the mobile device 300 in place, so that the mobile device 200 remains fixed relative to the body 110 and/or the mobile device holder 100.

Figure 5:
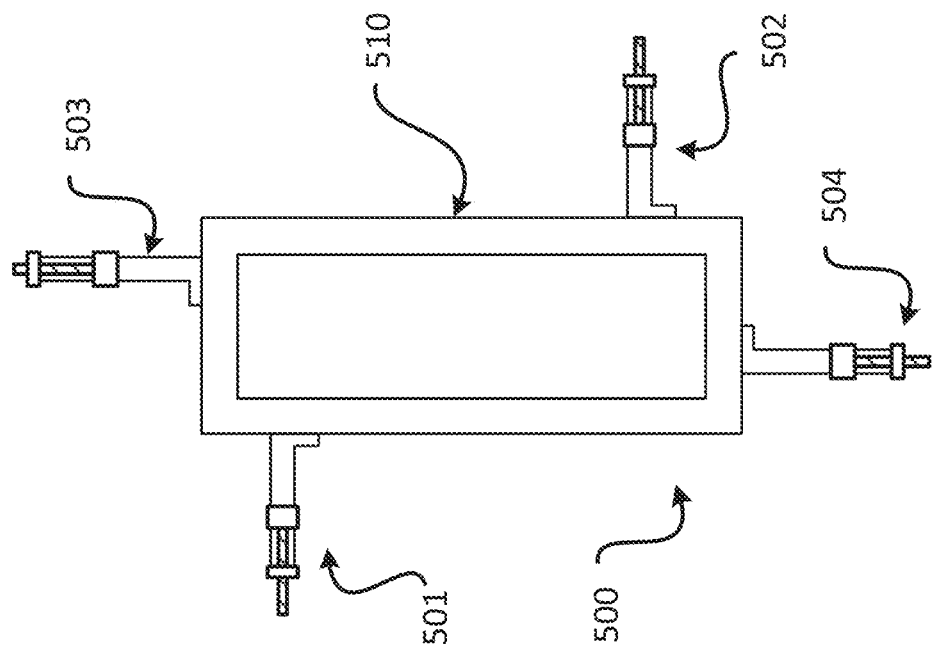
FIG. 5 illustrates an exemplary view of another configurable mobile device holder.
Figure 4:
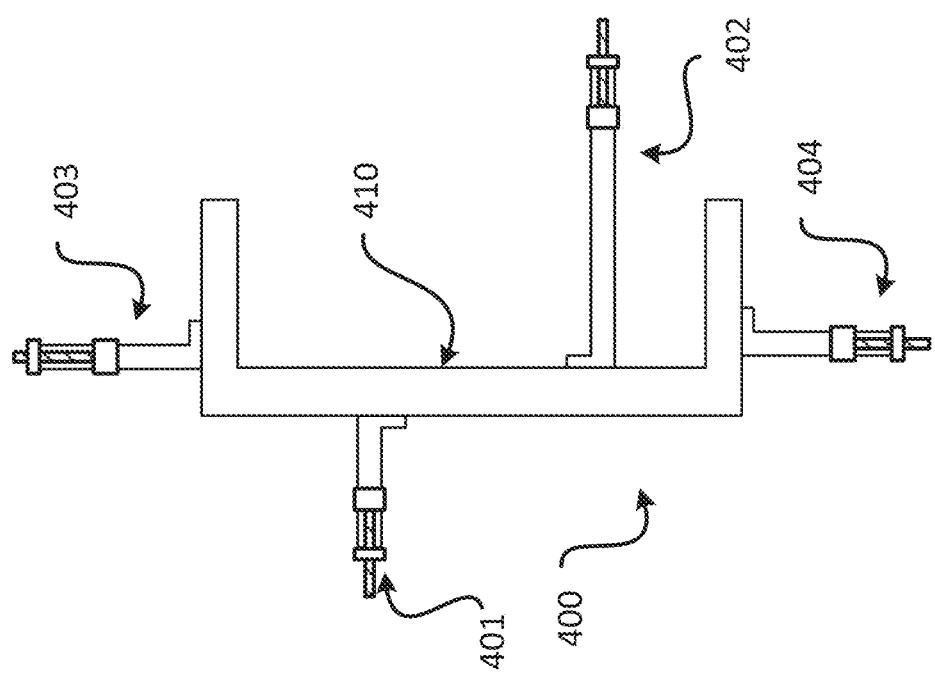
FIG. 4 illustrates an exemplary view of another configurable mobile device holder.

Different implementations of a mobile device holder may have components with different shapes, sizes and/or materials. For example, FIGS. 1-3 illustrate a mobile device holder 100 with a body 110 having an I shape. However, the body 110 may have different shapes. FIGS. 4 and 5 illustrate mobile device holders with different bodies and assemblies.

FIG. 4 illustrates a mobile device holder 400 that includes a body 410, a first assembly 401, a second assembly 402, a third assembly 403 and a fourth assembly 404. The body 410 may include the plurality of cavities 112, as described for the body 110. The body 410 has a C shape. The first assembly 401, the second assembly 402, the third assembly 403 and the fourth assembly 404 are each similar to the first assembly 101, the second assembly 102, the third assembly 103 and the fourth assembly 104. Thus, the first assembly 401, the second assembly 402, the third assembly 403 and the fourth assembly 404 may each include similar components, such as an arm (e.g., 120*a*), a fastener (e.g., 130*a*), a slider (e.g., 140*a*), a cap (e.g., 150*a*), a fastener (e.g., 160*a*) and a screw (e.g., 170*a*). The assemblies may have different lengths. For example, the arm of the second assembly 402 is longer than the arms of the other assemblies. The arm of the first assembly 401, the arm of the third assembly 403 and the arm of the fourth assembly 404 may be shorter than the arm of the second assembly 402.

FIG. 5 illustrates a mobile device holder 500 that includes a body 510, a first assembly 501, a second assembly 502, a third assembly 503 and a fourth assembly 504. The body 510 may include the plurality of cavities 112, as described for the body 110. The body 510 has an O shape and/or a D shape. The first assembly 501, the second assembly 502, the third assembly 503 and the fourth assembly 504 are each similar to the first assembly 101, the second assembly 102, the third assembly 103 and the fourth assembly 104. Thus, the first assembly 501, the second assembly 502, the third assembly 503 and the fourth assembly 504 may each include similar components, such as an arm (e.g., 120*a*), a fastener (e.g., 130*a*), a slider (e.g., 140*a*), a cap (e.g., 150*a*), a fastener (e.g., 160*a*) and a screw (e.g., 170*a*). The assemblies (e.g., 501, 502, 503, 504) may have different lengths.

It is noted that in some implementations, one or more of assemblies may be fixed and not moveable. For example, one or more assemblies may be coupled to the body (e.g., 110, 410, 510) in such a way that the assembly cannot be moved to a different location. For example, the fourth assembly (e.g., 104, 404, 504) may be fixed. In such instances, the arm (e.g., 120*d*) of the assembly may be permanently coupled to the body. In some implementations, the arm (of the fourth assembly) may be a fixed portion of the body. The fixed portion may be a coupling portion of the body, that is configured to provide an opposing force to a force applied by the third assembly. However, different implementations may have different coupling portions. In another example, the arm (e.g., 120*d*) may be part of the body (e.g., 110, 410, 510). This may be the case when antennas are not likely to be located in a lower portion of the mobile device.

Figure 6:
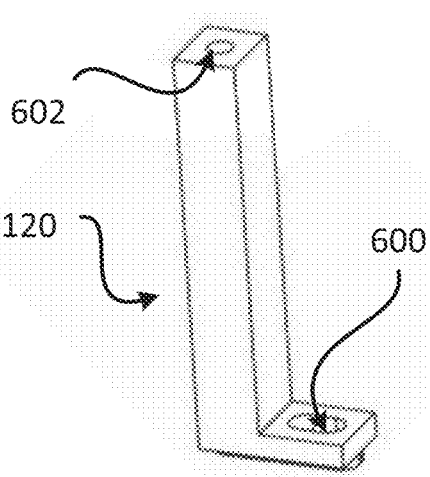
FIG. 6 illustrates an exemplary view of an arm for a mobile device holder.
Figure 7:
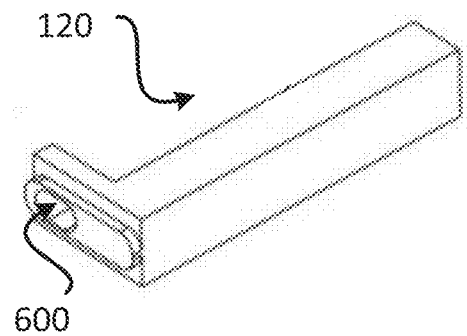
FIG. 7 illustrates another exemplary view of an arm for a mobile device holder.
Figure 8:
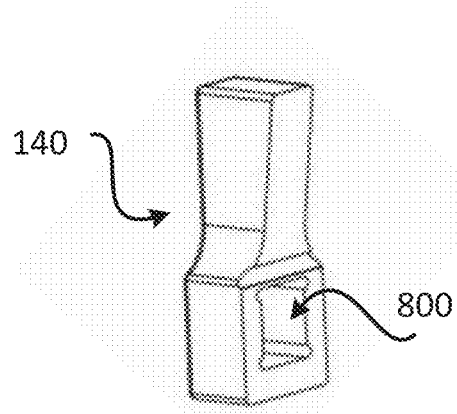
FIG. 8 illustrates an exemplary view of a slider for a mobile device holder.
Figure 9:
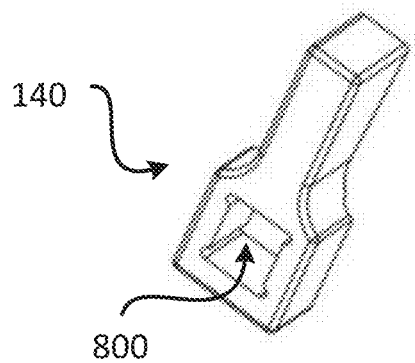
FIG. 9 illustrates another exemplary view of a slider for a mobile device holder.
Figure 10:
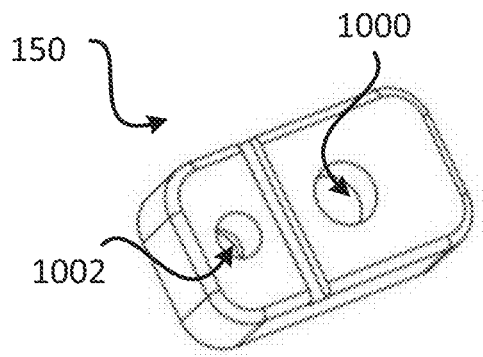
FIG. 10 illustrates an exemplary view of a cap for a mobile device holder.
Figure 11:
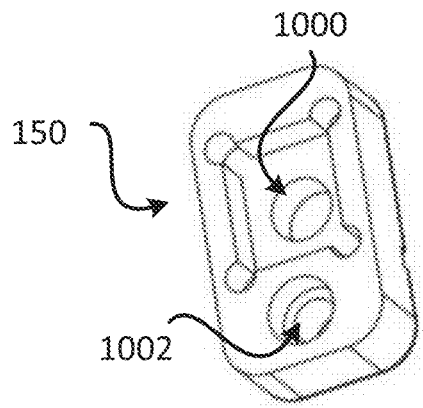
FIG. 11 illustrates another exemplary view of a cap for a mobile device holder.

FIGS. 6-11 illustrate various views of the components of a mobile device holder. FIGS. 6 and 7 illustrate an arm 120. The arm 120 includes a first cavity 600 and a second cavity 602. A fastener (e.g., 130*a*) may be used to couple the arm 120 to a body (e.g., 110, 410, 510) through the first cavity 600. Another fastener (e.g., 160*a*) may be used to couple a cap (e.g., 150) to the arm 120 through the second cavity 602. The arm 120 has an L shape. However, the arm 120 may have different shapes. FIGS. 8-9 illustrate a slider 140. The slider 140 includes a cavity 800. The cavity 800 is used to couple the slider 140 to the arm 120. The slider 140 may be configured to move along the arm 120 through the cavity 800. The profile of the cavity 800 may match the profile cross section of the arm 120. FIGS. 10-11 illustrate a cap 150. The cap 150 includes a first cavity 1000 and a second cavity 1002. A fastener (e.g., 160*a*) may be used to couple the cap 150 to the arm 120, through the first cavity 1000. A screw (e.g., 170*a*) may be extended through the second cavity 1002 of the cap 150. Turning the screw (e.g., 170*a*) may move the screw, which may push the slider 140 along the arm 120.

Exemplary Sequence for Coupling a Mobile Device to a Mobile Device Holder

Figure 12:
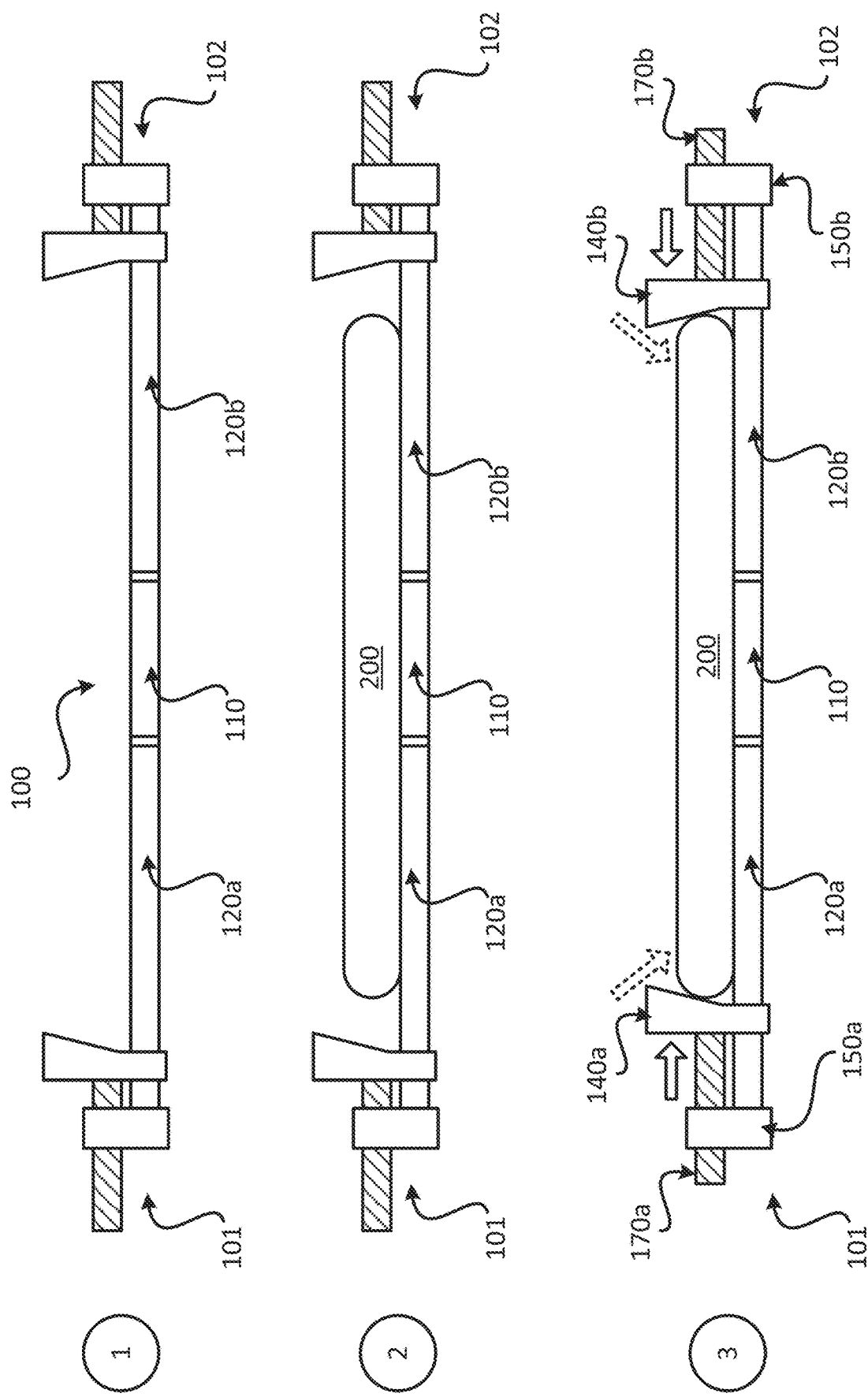
FIG. 12 illustrates an exemplary sequence for coupling a mobile device to a configurable mobile device holder.

FIG. 12 illustrates an exemplary sequence for coupling a mobile device to a mobile device holder. It should be noted that the sequence of FIG. 12 may combine one or more stages in order to simplify and/or clarify the sequence for coupling a mobile device to a mobile device holder. FIG. 12 illustrates a mobile device 200 being coupled to a mobile device holder 100. However, the sequence of FIG. 12 may be used to couple any mobile device to any of the mobile device holders described in the disclosure. In some implementations, the order of the processes may be changed or modified. In some implementations, one or more of processes may be replaced or substituted without departing from the spirit of the disclosure.

Stage 1 illustrates the mobile device holder 100. The mobile device holder 100 is a configurable mobile device holder 100. The mobile device holder 100 includes the first assembly 101 and the second assembly 102. The mobile device holder 100 may include a third assembly 103 and a fourth assembly 104, as described in FIG. 1. The first assembly 101 is coupled to the body 110. The second assembly 102 is coupled to the body 110.

Stage 2 illustrates a state after the mobile device 200 is positioned over the body 110. The mobile device 200 may be positioned with the front side or the back side of the mobile device 200 facing the body 110.

Stage 3 illustrates a state after the first screw 170a is turned, which pushes the first slider 140a towards a side of the mobile device 200. The first slider 140a moves along the first arm 120a. Stage 3 also illustrates a state after the second screw 170b is turned, which pushes the second slider 140b towards another side of the mobile device 200. The second slider 140b moves along the second arm 120b. The first screw 170a and the second screw 170b help hold and lock the mobile device 200 in place. Moreover, the first slider 140a and the second slider 140b have an angled surface, which helps provide a force on the mobile device 200 that pushes the mobile device 200 towards the body 110.

It is noted that the third assembly 103 and the fourth assembly 104 are not shown in FIG. 12. However, the screws of the third assembly 103 and the fourth assembly 104 may be turned in a similar fashion to secure and hold the mobile device 200.

Exemplary Configurable Mobile Device Holder

Figure 13:
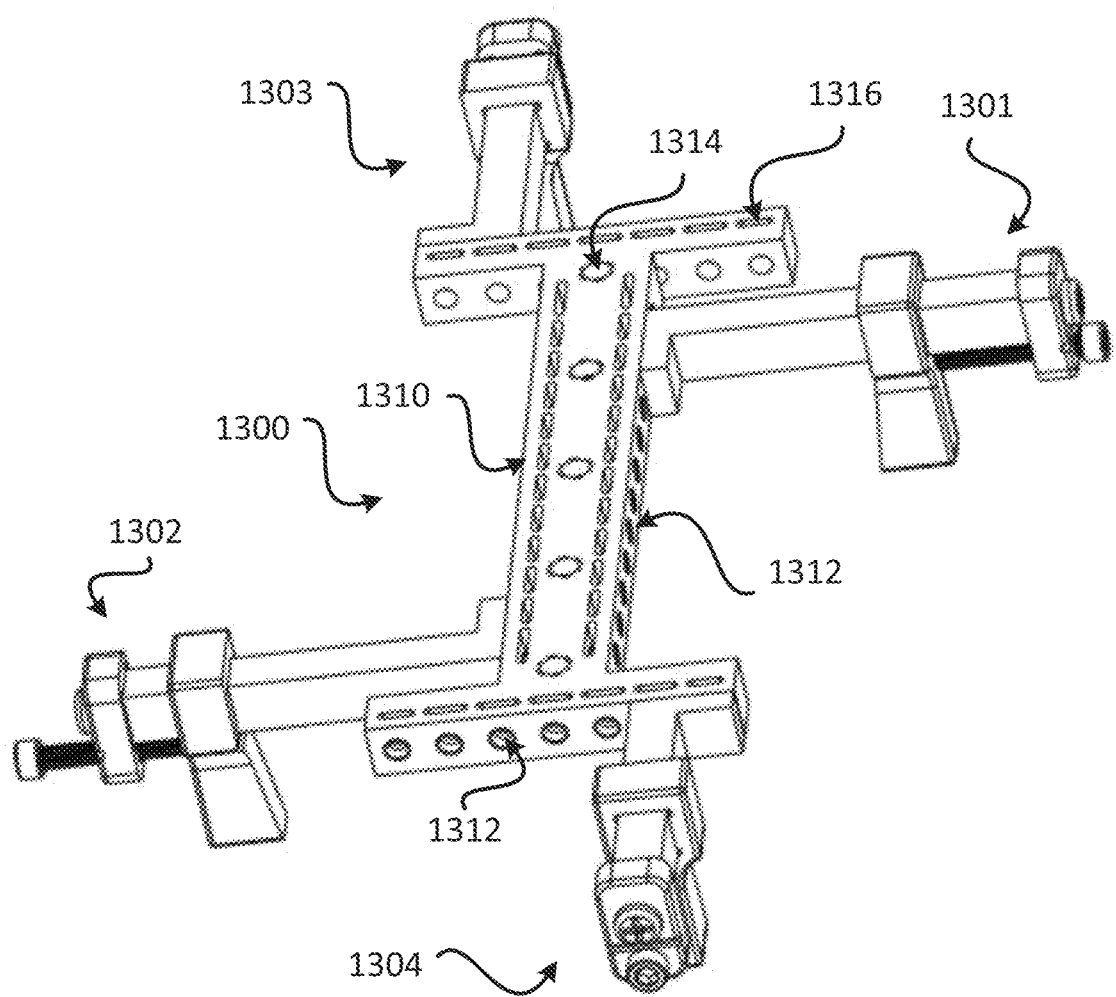
FIG. 13 illustrates an exemplary view of a configurable mobile device holder with snap on coupling.

FIG. 13 illustrates a view of another mobile device holder 1300. The mobile device holder 1300 may be a configurable mobile device holder. The mobile device holder 1300 is configured to hold and/or couple to mobile devices of various shapes and/or sizes. As will be further described below, the mobile device holder 1300 includes moveable and/or configurable components that can be located in different locations so as to not interfere with antennas of a mobile device. Moreover, the various components are made of non-metallic materials so as to no affect signals (e.g., radio frequency (RF) signal, 5G RF millimeter wave signal) coming to and from the antennas of the mobile device.

The mobile device holder 1300 is similar to the mobile device holder 100, and thus includes similar components as the mobile device holder 100. However, the mobile device holder 1300 includes components with snap on coupling. In some implementations, the mobile device holder 1300 may bypass the use of one or more fasteners to couple assemblies to the body and/or caps to arms.

The mobile device holder 1300 includes the body 1310, a first assembly 1301, a second assembly 1302, a third assembly 1303 and a fourth assembly 1304. The body 1310 is similar to the body 110 of FIG. 1. The body 1310 includes a plurality of cavities 1312, a plurality of cavities 1314, and a plurality of cavities 1316. The first assembly 1301, the second assembly 1302, the third assembly 1303 and the fourth assembly 1304 may be coupled to different portions of the body 1310. The first assembly 1301, the second assembly 1302, the third assembly 1303 and the fourth assembly 1304 may be coupled to the body 1310 through a snap on coupling, which is further described below in at least FIGS. 14-16.

Figure 14:
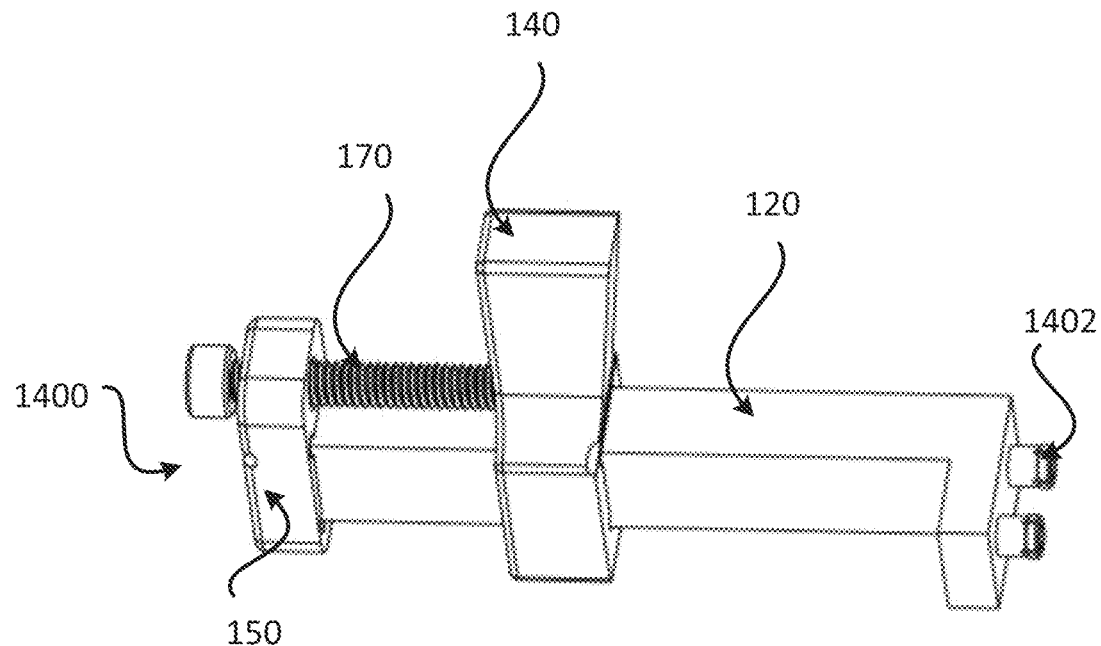
FIG. 14 illustrates an exemplary view of an arm and slider assembly with snap on coupling for a configurable mobile device holder.
Figure 15:
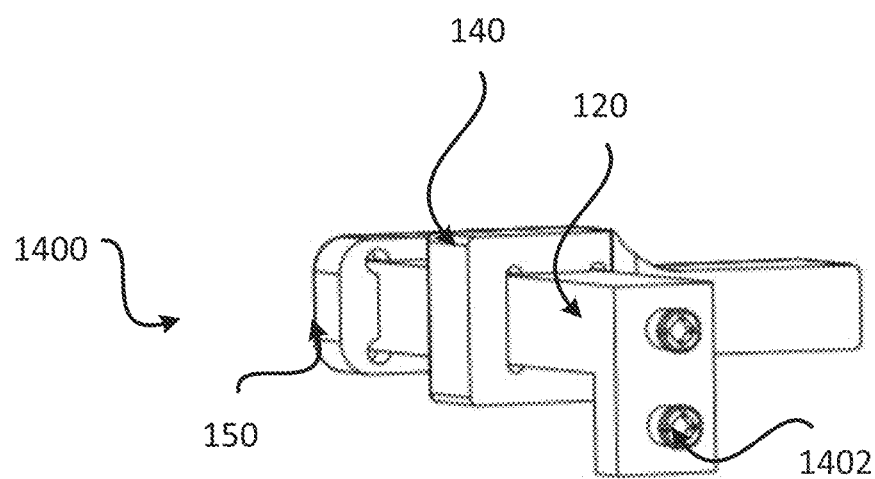
FIG. 15 illustrates an exemplary view of an arm and slider assembly with snap on coupling for a configurable mobile device holder.

FIGS. 14 and 15 illustrate an assembly 1400. The assembly 1400 may represent the first assembly 1301, the second assembly 1302, the third assembly 1303 and/or the fourth assembly 1304. The assembly 1400 includes an arm 120, a slider 140, a cap 150, and a screw 170. The arm 120 includes at least one protrusion 1402. The at least one protrusion 1402 allows the arm 120 to securely couple to the body 1310. The at least one protrusion 1402 may insert in at least one cavity 1312 of the body 1310. The at least one protrusion 1402 may snap in and out of the at least one cavity 1312, thus enabling snap on coupling. Portions of the at least one protrusion 1402 may be located in the at least one cavity 1316, which holds the at least one protrusion 1402 and the corresponding arm 120 into place with the body 1310. The at least one protrusion 1402 may have different shapes. In one example, the at least one protrusion 1402 may have a cylindrical shape. The at least one protrusion 1402 may have a rigid portion and a flexible portion. When in the relaxed position, the flexible portion may have a cross section that is larger than the cross section of the rigid portion. The flexible portion of the at least one protrusion 1402 may bend inwards when inserted in a cavity so that the at least one protrusion 1402 may be inserted in the cavity. The flexible portion of the at least one protrusion 1402 may snap back outwards once the flexible portion passes through the cavity, which enables the at least one protrusion 1402 to couple and lock with another component. The cap 150 may be coupled to the arm 120 through a snap on coupling. The cap 150 may include protrusions similar to the protrusion 1402. In some implementations, the arm 120 may include another protrusion that may be used to couple the arm 120 to the cap 150. The another protrusion of the arm 120 may be similar to the at least one protrusion 1402. The another protrusion of the arm 120 may couple to a cavity (e.g., 1000) of the cap 150. Different assemblies may have different lengths for the arm 120.

Figure 16:
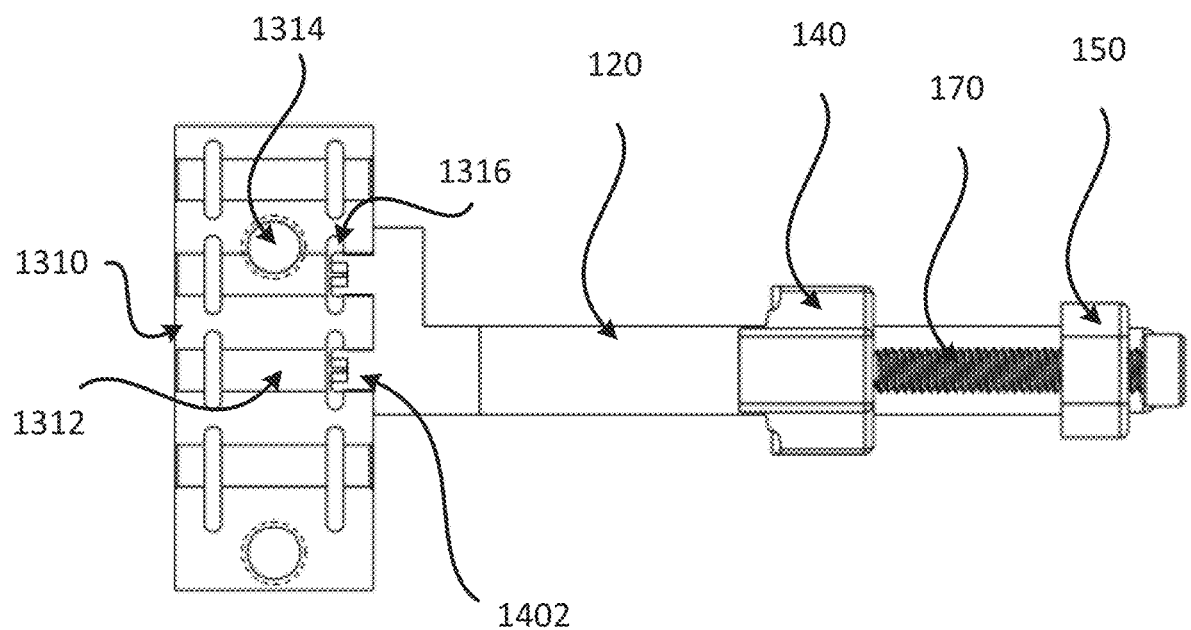
FIG. 16 illustrates an exemplary view of an arm coupled to a body through a snap on coupling.

FIG. 16 illustrates the arm 120 coupled to the body 1310 through at least one cavity 1312 and the at least one protrusion 1402. The body 1310 may have different shapes and/or sizes, as described for the body 110. For example, the body 1310 may include an I shape, a C shape, an O shape, a D shape and/or combination thereof. It is also noted that the caps (e.g., 150, 150a, 150b, 150c, 150d) may be coupled to different portions of the arm and is not limited to being coupled to an end portion of the arm.

Exemplary Mobile Device Positioner

Figure 17:
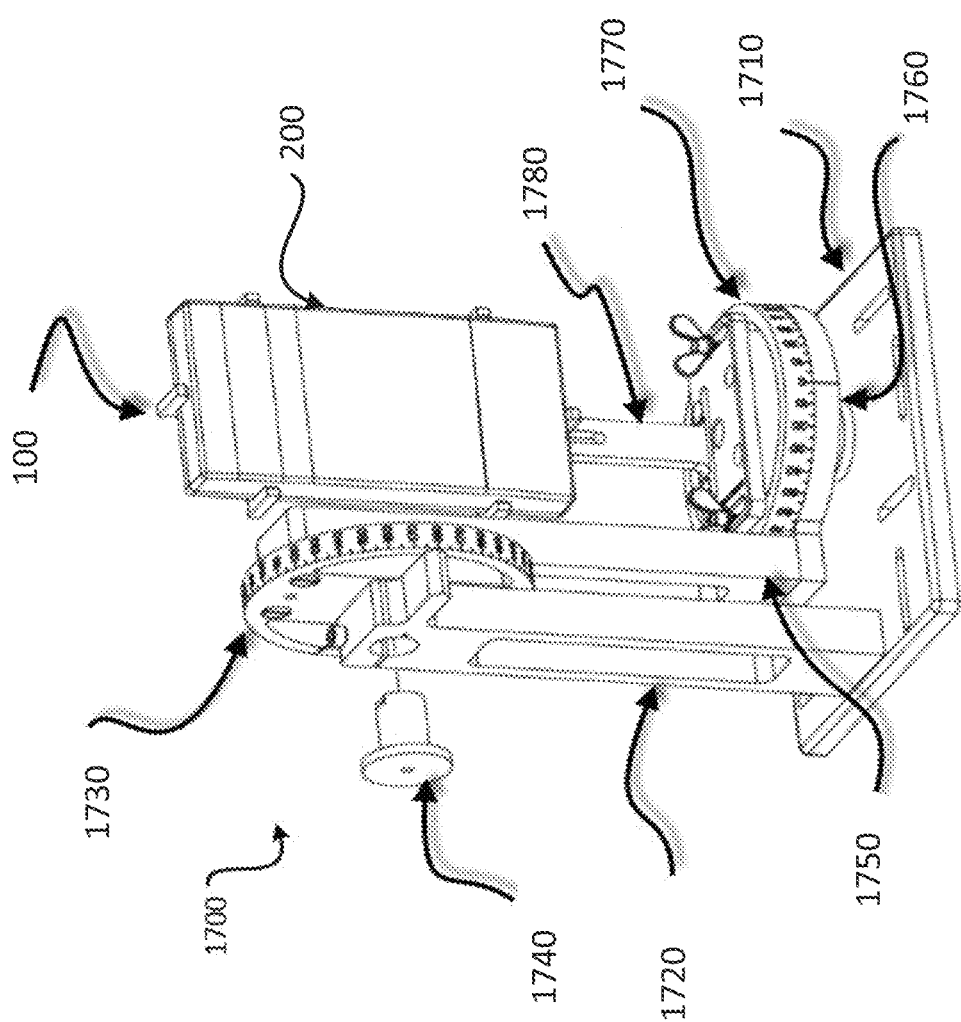
FIG. 17 illustrates an exemplary view of a manual positioner with a configurable mobile device holder.
Figure 18:
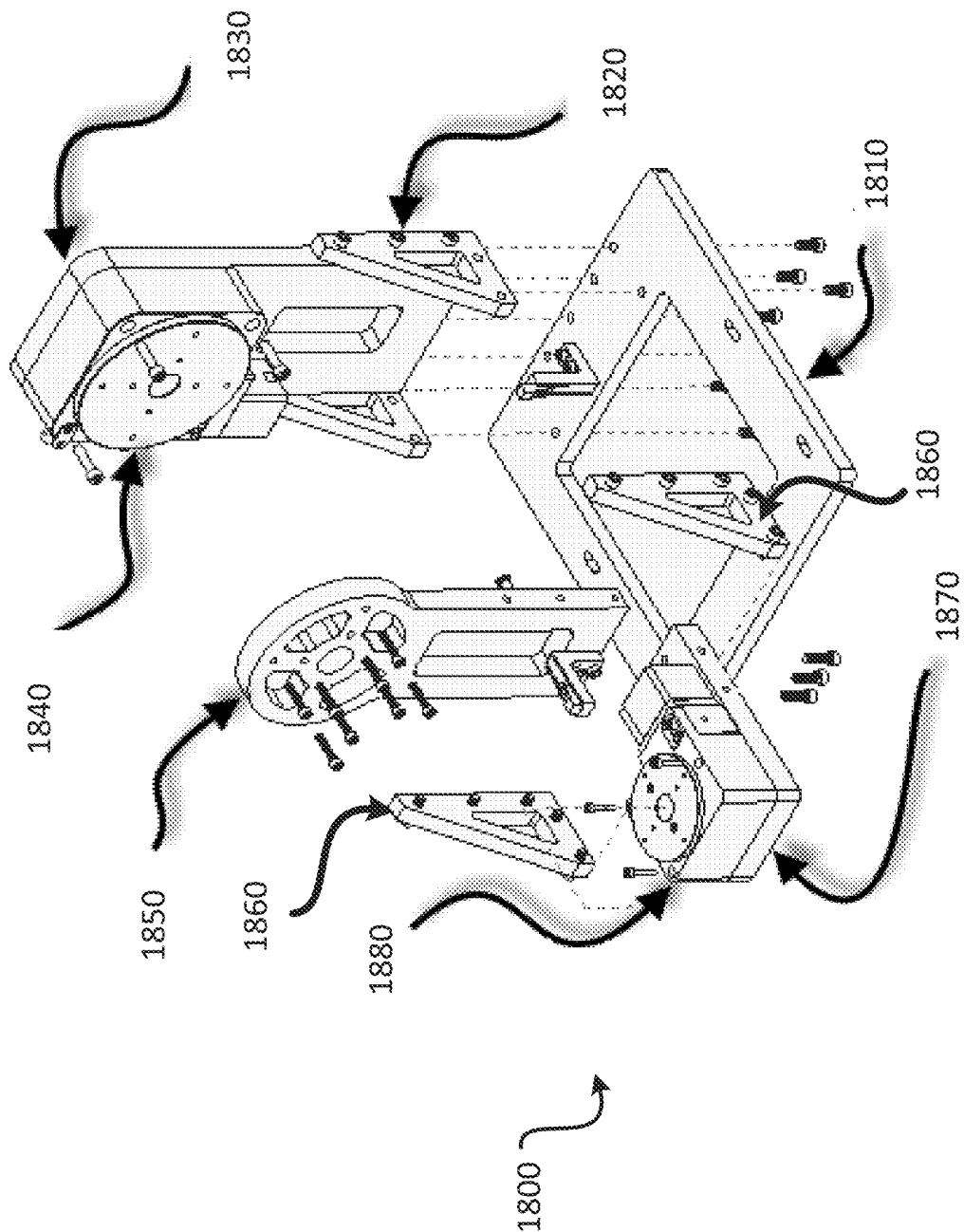
FIG. 18 illustrates an exemplary view of a motorized positioner that may be implemented with a configurable mobile device holder.

FIGS. 17 and 18 illustrate various positioners that include a mobile device holder. The positioners may be used when testing mobile devices for RF performances. The mobile device positioners help position the mobile device in various positions and angles in a chamber, to test and measure how the locations of various antennas in the mobile devices may perform under different scenarios.

FIG. 17 illustrates a mobile device positioner 1700. The mobile device positioner 1700 may be a manual mobile device positioner. The mobile device positioner 1700 includes a base 1710, a vertical frame 1720, a first pivot frame 1730, a pivot post 1740, a vertical arm frame 1750, a pivot mount 1760, a second pivot frame 1770, and an adapter 1780. The vertical frame 1720 is coupled to the base 1710. The first pivot frame 1730 is coupled to the vertical frame 1720 through the pivot post 1740. The vertical arm frame 1750 is coupled to the first pivot frame 1730. The pivot mount 1760 is coupled to the vertical arm frame 1750. The second pivot frame 1770 is coupled to the pivot mount 1760. The adapter 1780 is coupled to the second pivot frame 1770. The mobile device holder 100 is coupled to the adapter 1780. Fasteners may be used to couple the mobile device holder 100 to the adapter 1780. The fasteners may extend through cavities in the adapter 1780 and/or cavities (e.g., 114, 1314) of the mobile device holder 100. The mobile device 200 is coupled to the mobile device holder 100.

The first pivot frame 1730 may rotate and/or pivot along a first plane. The first plane may be a vertical plane. The first pivot frame 1730 may rotate relative to the vertical frame 1720. The first pivot frame 1730 may include a calibration disk that helps indicate the angle of the rotation (e.g., vertical rotation). Rotating the first pivot frame 1730 may cause the vertical arm frame 1750 to rotate, which ultimately causes the mobile device holder 100 and the mobile device 200 to rotate as well, in a similar fashion. The pivot post 1740 may be used to hold the first pivot frame 1730 at a particular angle and/or rotation.

The second pivot frame 1770 may rotate and/or pivot along a second plane. The second plane may be a horizontal plane. The second pivot frame 1770 may rotate relative to the pivot mount 1760. The second pivot frame 1770 may include a calibration disk that helps indicate the angle of the rotation (e.g., horizontal rotation). Rotating the second pivot frame 1770 may cause the adapter 1780 to rotate, which ultimately causes the mobile device holder 100 and the mobile device 200 to rotate as well, in a similar fashion. One or more fasteners may be used to hold the second pivot frame 1770 at a particular angle and/or rotation.

The first pivot frame 1730 and the second pivot frame 1770 may be used to position the mobile device 200 at any angle and position.

FIG. 18 illustrates a mobile device positioner 1800. The mobile device positioner 1800 may be a motorized mobile device positioner. The mobile device positioner 1800 includes a base 1810, a frame 1820, a vertical frame 1830, a first motor 1840, a rotating frame 1850, a frame 1860, a frame 1870 and a second motor 1880. The frame 1820 is coupled to the base 1810. The vertical frame 1830 is coupled to the frame 1820. The first motor 1840 is coupled to the vertical frame 1830. The rotating frame 1850 is coupled to the first motor 1840. The frame 1860 is coupled to the rotating frame 1850. The frame 1870 is coupled to the frame 1860. The second motor 1880 is coupled to the frame 1870. The first motor 1840 and/or the second motor 1880 may each be a stepper motor and/or a rotary stage. The rotating frame 1850 may be a vertically rotating frame.

The adapter 1780 may be coupled to the second motor 1880. The mobile device holder 100 may be coupled to the second motor 1880 directly or through the adapter 1780. For example, when the adapter 1780 is used, the adapter 1780 may be coupled to the second motor 1880, and the mobile device holder 100 may be coupled to the adapter 1780. Fasteners may be used to couple the mobile device holder 100 to the adapter 1780. The fasteners may extend through cavities in the adapter 1780 and/or cavities (e.g., 114, 1314) of the mobile device holder 100. The mobile device 200 is coupled to the mobile device holder 100.

The first motor 1840 is configured to rotate the rotating frame 1850 along a first plane. The first plane may be a vertical plane. The rotating frame 1850 may rotate relative to the first motor 1840 and/or the vertical frame 1830. Rotating the rotating frame 1850 may cause the mobile device holder 100 and the mobile device 200 to rotate as well, in a similar fashion.

The second motor 1880 is configured to rotate the adapter 1780 and/or the mobile device holder 100 along a second plane. The second plane may be a horizontal plane. The adapter 1780 and/or the mobile device holder 100 may rotate relative to the second motor 1880 and/or the frame 1870. Rotating the adapter 1780 and/or the mobile device holder 100 may cause the mobile device 200 to rotate as well, in a similar fashion. The first motor 1840 and the second motor 1880 may be used to position the mobile device 200 at any angle and position.

FIGS. 17 and 18 illustrate mobile device positioners with various components and/or parts. It is noted that some of these components and/or parts may be combined and/or omitted. For example, the frame 1820 and the vertical frame 1830 may be the same component. In another example, the frame 1870 may be coupled to the rotating frame 1850 directly instead of through the frame 1860. In another example, the frame 1870 and the rotating frame 1850 may be the same component. In another example, the vertical arm frame 1750 and the pivot mount 1760 may be the same component. The various components and/or parts shown in FIGS. 17-18 may be mechanically coupled through various means, including fasteners and/or adhesives. In some implementations, a single component may be broken up into several components and/or parts. The various components and/or parts of the mobile device positioners (e.g., 1700, 1800) may include the same material and/or similar materials as the mobile device holder. It is noted that mobile device positioners may include any of the mobile device holders described in the disclosure. Different implementations may use different types of fasteners. A fastener may include a screw, bolt and/or nut. A frame may include a plate.

FIGS. 17-18 illustrate examples of mobile device positioners that includes a base (e.g., 1710, 1810), a first component coupled to the first frame, a second frame (e.g., 1750, 1760, 1850) coupled to the first component, a second component coupled to the second frame, and a mobile device holder (e.g., 100, 400, 500) coupled to the second component. The first component is configured to rotate a component along a first plane. The first component may include the first pivot frame 1730 and/or the first motor 1840. The first plane may include a vertical plane or a horizontal plane. The second component is configured to rotate a component along a second plane. The second component may include the second pivot frame 1770 and/or the second motor 1880. The second plane may include a vertical plane or a horizontal plane.

One or more of the components, processes, features, and/or functions illustrated in FIGS. 1-18 may be rearranged and/or combined into a single component, process, feature or function or embodied in several components, processes, or functions. Additional elements, components, processes, and/or functions may also be added without departing from the disclosure.

It is noted that the figures in the disclosure may represent actual representations and/or conceptual representations of various parts, components, objects, devices, holders, and/or positioners. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The following provides an overview of aspects of the present disclosure:

Aspect 1: A mobile device holder comprising: a body comprising a plurality of cavities; a first assembly coupled to the body, wherein the first assembly is configurable to be coupled to different portions of the body, the first assembly comprising: a first arm configured to be coupled to the body; a first slider coupled to the first arm, wherein the first slider is configured to move along the first arm; a first cap coupled to the first arm; and a first screw coupled to the first cap, wherein the first screw is configured to move the first slider along the first arm and towards the body; a second assembly coupled to the body, wherein the second assembly is configurable to be coupled to different portions of the body, the second assembly comprising: a second arm configured to be coupled to the body; a second slider coupled to the second arm, wherein the second slider is configured to move along the second arm; a second cap coupled to the second arm; and a second screw coupled to the second cap, wherein the second screw is configured to move the second slider along the second arm and towards the body; and a third assembly coupled to the body, wherein the third assembly is configurable to be coupled to different portions of the body, the third assembly comprising: a third arm configured to be coupled to the body; a third slider coupled to the third arm, wherein the third slider is configured to move along the third arm; a third cap coupled to the third arm; and a third screw coupled to the third cap, wherein the third screw is configured to move the third slider along the third arm and towards the body.

Aspect 2: The mobile device holder of aspect 1, further comprising a fourth assembly coupled to the body, wherein the fourth assembly is configurable to be coupled to different portions of the body, the fourth assembly comprising: a fourth arm configured to be coupled to the body; a fourth slider coupled to the fourth arm, wherein the fourth slider is configured to move along the fourth arm; a fourth cap coupled to the fourth arm; and a fourth screw coupled to the fourth cap, wherein the fourth screw is configured to move the fourth slider along the fourth arm and towards the body.

Aspect 3: The mobile device holder of aspects 1 through 2, wherein the first assembly is coupled to a first portion of the body, wherein the second assembly is coupled to a second portion of the body, and wherein the third assembly is coupled to a third portion of the body.

Aspect 4: The mobile device holder of aspects 1 through 3, wherein the first arm is coupled to the body through a first cavity of the body using snap on coupling, wherein the second arm is coupled to the body through a second cavity of the body using snap on coupling, and wherein the third arm is coupled to the body through a third cavity of the body using snap on coupling.

Aspect 5: The mobile device holder of aspect 4, wherein the first arm includes at least one protrusion that is configured to snap in the first cavity of the body, wherein the second arm includes at least one protrusion that is configured to snap in the second cavity of the body, and wherein the third arm includes at least one protrusion that is configured to snap in the third cavity of the body.

Aspect 6: The mobile device holder of aspects 1 through 3, wherein the first arm is coupled to the body through a first cavity of the body using a first fastener, wherein the second arm is coupled to the body through a second cavity of the body using a second fastener, and wherein the third arm is coupled to the body through a third cavity of the body using a third fastener.

Aspect 7: The mobile device holder of aspects 1 through 6, when a mobile device is coupled to the mobile device holder, the first assembly is configured to apply a force on the mobile device in a first direction, and the second assembly is configured to apply another force on the mobile device in a second direction.

Aspect 8: The mobile device holder of aspects 1 through 7, wherein the body, the first assembly, the second assembly and the third assembly include at least one non-metallic material.

Aspect 9: The mobile device holder of aspects 1 through 8, wherein the body includes polycarbonate, wherein the first slider, the second slider, and the third slider include Ertalyte PET-P, and wherein the first screw, the second screw and the third screw include Peek.

Aspect 10: The mobile device holder of aspects 1 through 9, wherein the body, the first assembly, the second assembly and the third assembly are free of a metallic material.

Aspect 11: The mobile device holder of aspects 1 through 10, wherein the first slider, the second slider and the third slider have an angle surface.

Aspect 12: The mobile device holder of aspects 1 through 11, wherein the body includes an I shape, a C shape, an O shape, a D shape and/or combination thereof.

Aspect 13: The mobile device holder of aspects 1 through 12, further comprising a fourth assembly, wherein the fourth assembly is fixed relative to the body.

Aspect 14: The mobile device holder of aspects 1 through 12, wherein the body includes a coupling portion configured to provide an opposing force to a force applied by the third assembly.

Aspect 15: A mobile device positioner comprising: a base; a first frame coupled to the base; a first component coupled to the first frame, the first component configured to rotate a component along a first plane; a second frame coupled to the first component; a second component coupled to the second frame, the second component configured to rotate a component along a second plane; and a mobile device holder coupled to the second component, the mobile device holder comprising: a body comprising a plurality of cavities; a first assembly coupled to the body, wherein the first assembly is configurable to be coupled to different portions of the body, the first assembly comprising: a first arm configured to be coupled to the body; a first slider coupled to the first arm, wherein the first slider is configured to move along the first arm; a first cap coupled to the first arm; and a first screw coupled to the first cap, wherein the first screw is configured to move the first slider along the first arm and towards the body; a second assembly coupled to the body, wherein the second assembly is configurable to be coupled to different portions of the body, the second assembly comprising: a second arm configured to be coupled to the body; a second slider coupled to the second arm, wherein the second slider is configured to move along the second arm; a second cap coupled to the second arm; and a second screw coupled to the second cap, wherein the second screw is configured to move the second slider along the second arm and towards the body; and a third assembly coupled to the body, wherein the third assembly is configurable to be coupled to different portions of the body, the third assembly comprising: a third arm configured to be coupled to the body; a third slider coupled to the third arm, wherein the third slider is configured to move along the third arm; a third cap coupled to the third arm; and a third screw coupled to the third cap, wherein the third screw is configured to move the third slider along the third arm and towards the body.

Aspect 16: The mobile device positioner of aspect 15, wherein the first component includes a first pivot frame, and wherein the second component includes a second pivot frame.

Aspect 17: The mobile device positioner of aspects 15 through 16, wherein the first component includes a first motor, and wherein the second component includes a second motor.

Aspect 18: The mobile device positioner of aspects 15 through 17, wherein the first plane includes a vertical plane, and wherein the second plane includes a horizontal plane.

Aspect 19: The mobile device positioner of aspects 15 through 17, wherein the first plane includes a horizontal plane, and wherein the second plane includes a vertical plane.

Aspect 20: The mobile device positioner of aspects 15 through 19, wherein the mobile device holder is coupled to the second component.

Aspect 21: The mobile device positioner of aspects 15 through 20, further comprising an adapter, wherein the mobile device holder is coupled to the second component through the adapter.

Aspect 22: The mobile device positioner of aspects 15 through 21, further comprising a fourth assembly coupled to the body, wherein the fourth assembly is configurable to be coupled to different portions of the body, the fourth assembly comprising: a fourth arm configured to be coupled to the body; a fourth slider coupled to the fourth arm, wherein the fourth slider is configured to move along the fourth arm; a fourth cap coupled to the fourth arm; and a fourth screw coupled to the fourth cap, wherein the fourth screw is configured to move the fourth slider along the fourth arm and towards the body.

Aspect 23: The mobile device positioner of aspects 15 through 22, wherein the first assembly is coupled to a first portion of the body, wherein the second assembly is coupled to a second portion of the body, and wherein the third assembly is coupled to a third portion of the body.

Aspect 24: The mobile device positioner of aspects 15 through 23, wherein the first arm is coupled to the body through a first cavity of the body using snap on coupling, wherein the second arm is coupled to the body through a second cavity of the body using snap on coupling, and wherein the third arm is coupled to the body through a third cavity of the body using snap on coupling.

Aspect 25: The mobile device positioner of aspect 24, wherein the first arm includes at least one protrusion that is configured to snap in the first cavity of the body, wherein the second arm includes at least one protrusion that is configured to snap in the second cavity of the body, and wherein the third arm includes at least one protrusion that is configured to snap in the third cavity of the body.

Aspect 26: The mobile device positioner of aspects 15 through 23, wherein the first arm is coupled to the body through a first cavity of the body using a first fastener, wherein the second arm is coupled to the body through a second cavity of the body using a second fastener, and wherein the third arm is coupled to the body through a third cavity of the body using a third fastener.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A mobile device holder comprising:
a body comprising a plurality of cavities;
a first assembly coupled to the body, wherein the first assembly is configurable to be coupled to different portions of the body, the first assembly comprising:
 a first arm configured to be coupled to the body;
 a first slider coupled to the first arm, wherein the first slider is configured to move along the first arm;
 a first cap coupled to the first arm; and
 a first screw coupled to the first cap, wherein the first screw is configured to move the first slider along the first arm and towards the body;
a second assembly coupled to the body, wherein the second assembly is configurable to be coupled to different portions of the body, the second assembly comprising:
 a second arm configured to be coupled to the body;

a second slider coupled to the second arm, wherein the second slider is configured to move along the second arm;
a second cap coupled to the second arm; and
a second screw coupled to the second cap, wherein the second screw is configured to move the second slider along the second arm and towards the body; and
a third assembly coupled to the body, wherein the third assembly is configurable to be coupled to different portions of the body, the third assembly comprising:
a third arm configured to be coupled to the body;
a third slider coupled to the third arm, wherein the third slider is configured to move along the third arm;
a third cap coupled to the third arm; and
a third screw coupled to the third cap, wherein the third screw is configured to move the third slider along the third arm and towards the body.

2. The mobile device holder of claim 1, further comprising a fourth assembly coupled to the body, wherein the fourth assembly is configurable to be coupled to different portions of the body, the fourth assembly comprising:
a fourth arm configured to be coupled to the body;
a fourth slider coupled to the fourth arm, wherein the fourth slider is configured to move along the fourth arm;
a fourth cap coupled to the fourth arm; and
a fourth screw coupled to the fourth cap, wherein the fourth screw is configured to move the fourth slider along the fourth arm and towards the body.

3. The mobile device holder of claim 1,
wherein the first assembly is coupled to a first portion of the body,
wherein the second assembly is coupled to a second portion of the body, and
wherein the third assembly is coupled to a third portion of the body.

4. The mobile device holder of claim 1,
wherein the first arm is coupled to the body through a first cavity of the body using snap on coupling,
wherein the second arm is coupled to the body through a second cavity of the body using snap on coupling, and
wherein the third arm is coupled to the body through a third cavity of the body using snap on coupling.

5. The mobile device holder of claim 4,
wherein the first arm includes at least one protrusion that is configured to snap in the first cavity of the body,
wherein the second arm includes at least one protrusion that is configured to snap in the second cavity of the body, and
wherein the third arm includes at least one protrusion that is configured to snap in the third cavity of the body.

6. The mobile device holder of claim 1,
wherein the first arm is coupled to the body through a first cavity of the body using a first fastener,
wherein the second arm is coupled to the body through a second cavity of the body using a second fastener, and
wherein the third arm is coupled to the body through a third cavity of the body using a third fastener.

7. The mobile device holder of claim 1, when a mobile device is coupled to the mobile device holder, the first assembly is configured to apply a force on the mobile device in a first direction, and the second assembly is configured to apply another force on the mobile device in a second direction.

8. The mobile device holder of claim 1, wherein the body, the first assembly, the second assembly and the third assembly include at least one non-metallic material.

9. The mobile device holder of claim 1,
wherein the body includes polycarbonate,
wherein the first slider, the second slider, and the third slider include Ertalyte PET-P, and
wherein the first screw, the second screw and the third screw include Peek.

10. The mobile device holder of claim 1, wherein the body, the first assembly, the second assembly and the third assembly are free of a metallic material.

11. The mobile device holder of claim 1, wherein the first slider, the second slider and the third slider have an angle surface.

12. The mobile device holder of claim 1, wherein the body includes an I shape, a C shape, an O shape, a D shape and/or combination thereof.

13. The mobile device holder of claim 1, further comprising a fourth assembly, wherein the fourth assembly is fixed relative to the body.

14. The mobile device holder of claim 1, wherein the body includes a coupling portion configured to provide an opposing force to a force applied by the third assembly.

15. A mobile device positioner comprising:
a base;
a first frame coupled to the base;
a first component coupled to the first frame, wherein the first component is configured to rotate a component along a first plane;
a second frame coupled to the first component;
a second component coupled to the second frame, wherein the second component is configured to rotate a component along a second plane; and
a mobile device holder coupled to the second component, the mobile device holder comprising:
a body comprising a plurality of cavities;
a first assembly coupled to the body, wherein the first assembly is configurable to be coupled to different portions of the body, the first assembly comprising:
a first arm configured to be coupled to the body;
a first slider coupled to the first arm, wherein the first slider is configured to move along the first arm;
a first cap coupled to the first arm; and
a first screw coupled to the first cap, wherein the first screw is configured to move the first slider along the first arm and towards the body;
a second assembly coupled to the body, wherein the second assembly is configurable to be coupled to different portions of the body, the second assembly comprising:
a second arm configured to be coupled to the body;
a second slider coupled to the second arm, wherein the second slider is configured to move along the second arm;
a second cap coupled to the second arm; and
a second screw coupled to the second cap, wherein the second screw is configured to move the second slider along the second arm and towards the body; and
a third assembly coupled to the body, wherein the third assembly is configurable to be coupled to different portions of the body, the third assembly comprising:
a third arm configured to be coupled to the body;
a third slider coupled to the third arm, wherein the third slider is configured to move along the third arm;
a third cap coupled to the third arm; and a third screw coupled to the third cap, wherein the third screw is configured to move the third slider along the third arm and towards the body.

16. The mobile device positioner of claim 15,
wherein the first component includes a first pivot frame, and
wherein the second component includes a second pivot frame.

17. The mobile device positioner of claim 15,
wherein the first component includes a first motor, and
wherein the second component includes a second motor.

18. The mobile device positioner of claim 15,
wherein the first plane includes a vertical plane, and
wherein the second plane includes a horizontal plane.

19. The mobile device positioner of claim 15,
wherein the first plane includes a horizontal plane, and
wherein the second plane includes a vertical plane.

20. The mobile device positioner of claim 15, wherein the mobile device holder is coupled to the second component.

21. The mobile device positioner of claim 15, further comprising an adapter, wherein the mobile device holder is coupled to the second component through the adapter.

22. The mobile device positioner of claim 15, further comprising a fourth assembly coupled to the body, wherein the fourth assembly is configurable to be coupled to different portions of the body, the fourth assembly comprising:
   a fourth arm configured to be coupled to the body;
   a fourth slider coupled to the fourth arm, wherein the fourth slider is configured to move along the fourth arm;
   a fourth cap coupled to the fourth arm; and
   a fourth screw coupled to the fourth cap, wherein the fourth screw is configured to move the fourth slider along the fourth arm and towards the body.

23. The mobile device positioner of claim 15,
wherein the first assembly is coupled to a first portion of the body,
wherein the second assembly is coupled to a second portion of the body, and
wherein the third assembly is coupled to a third portion of the body.

24. The mobile device positioner of claim 15,
wherein the first arm is coupled to the body through a first cavity of the body using snap on coupling,
wherein the second arm is coupled to the body through a second cavity of the body using snap on coupling, and
wherein the third arm is coupled to the body through a third cavity of the body using snap on coupling.

25. The mobile device positioner of claim 24,
wherein the first arm includes at least one protrusion that is configured to snap in the first cavity of the body,
wherein the second arm includes at least one protrusion that is configured to snap in the second cavity of the body, and
wherein the third arm includes at least one protrusion that is configured to snap in the third cavity of the body.

26. The mobile device positioner of claim 15,
wherein the first arm is coupled to the body through a first cavity of the body using a first fastener,
wherein the second arm is coupled to the body through a second cavity of the body using a second fastener, and
wherein the third arm is coupled to the body through a third cavity of the body using a third fastener.

* * * * *